United States Patent
Suzuki et al.

(10) Patent No.: US 7,435,960 B2
(45) Date of Patent: *Oct. 14, 2008

(54) CHARGED PARTICLE BEAM APPARATUS

(75) Inventors: Makoto Suzuki, Hitachinaka (JP); Kenji Tanimoto, Hitachinaka (JP); Yuko Sasaki, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/808,376

(22) Filed: Jun. 8, 2007

(65) Prior Publication Data

US 2007/0241278 A1 Oct. 18, 2007

Related U.S. Application Data

(63) Continuation of application No. 11/183,906, filed on Jul. 19, 2005, now Pat. No. 7,241,996.

(30) Foreign Application Priority Data

Jul. 20, 2004 (JP) ............................. 2004-211415

(51) Int. Cl.
*H01J 37/28* (2006.01)
*H01J 37/256* (2006.01)
(52) U.S. Cl. .................. 250/310; 250/311; 250/306; 250/492.2; 250/492.3
(58) Field of Classification Search ................. 250/310, 250/311, 306, 492.2, 492.3
See application file for complete search history.

(56) References Cited

U.S. PATENT DOCUMENTS

| 6,630,681 | B1 | 10/2003 | Kojima |
| 7,022,986 | B2 | 4/2006 | Shinada et al. |
| 7,049,585 | B2 * | 5/2006 | Nakasuji et al. ............. 250/310 |
| 7,109,484 | B2 * | 9/2006 | Nakasuji et al. ............. 250/310 |
| 7,241,996 | B2 * | 7/2007 | Suzuki et al. ............... 250/310 |
| 2002/0185599 | A1 | 12/2002 | Kimura et al. |
| 2004/0108458 | A1 | 6/2004 | Gerlach et al. |
| 2004/0222376 | A1 | 11/2004 | Sasaki et al. |

FOREIGN PATENT DOCUMENTS

| JP | 2001-006588 | 1/2001 |
| JP | 2001-093831 | 4/2001 |

* cited by examiner

*Primary Examiner*—Nikita Wells
(74) *Attorney, Agent, or Firm*—Dickstein Shapiro LLP

(57) ABSTRACT

A charged particle beam apparatus obtains an image by detecting a generation signal inclusively indicative of secondary electrons generated from a specimen. The apparatus has an input unit for inputting current and voltage values to be applied to a charged particle optical system through which the charged particle beam travels, a memory unit for storing shape, position and physical properties of the charged particle optical system and accuracy of the applied current or voltage, an electromagnetic field calculation unit for calculating an electromagnetic field near a path of the charged particle beam, a charged particle trajectory calculation unit for calculating a trajectory of the charged particle beam in the calculated electromagnetic field, a memory unit for storing a result of the trajectory calculation and a controller for controlling the charged particle optical system on the basis of the result of the trajectory calculation.

3 Claims, 5 Drawing Sheets

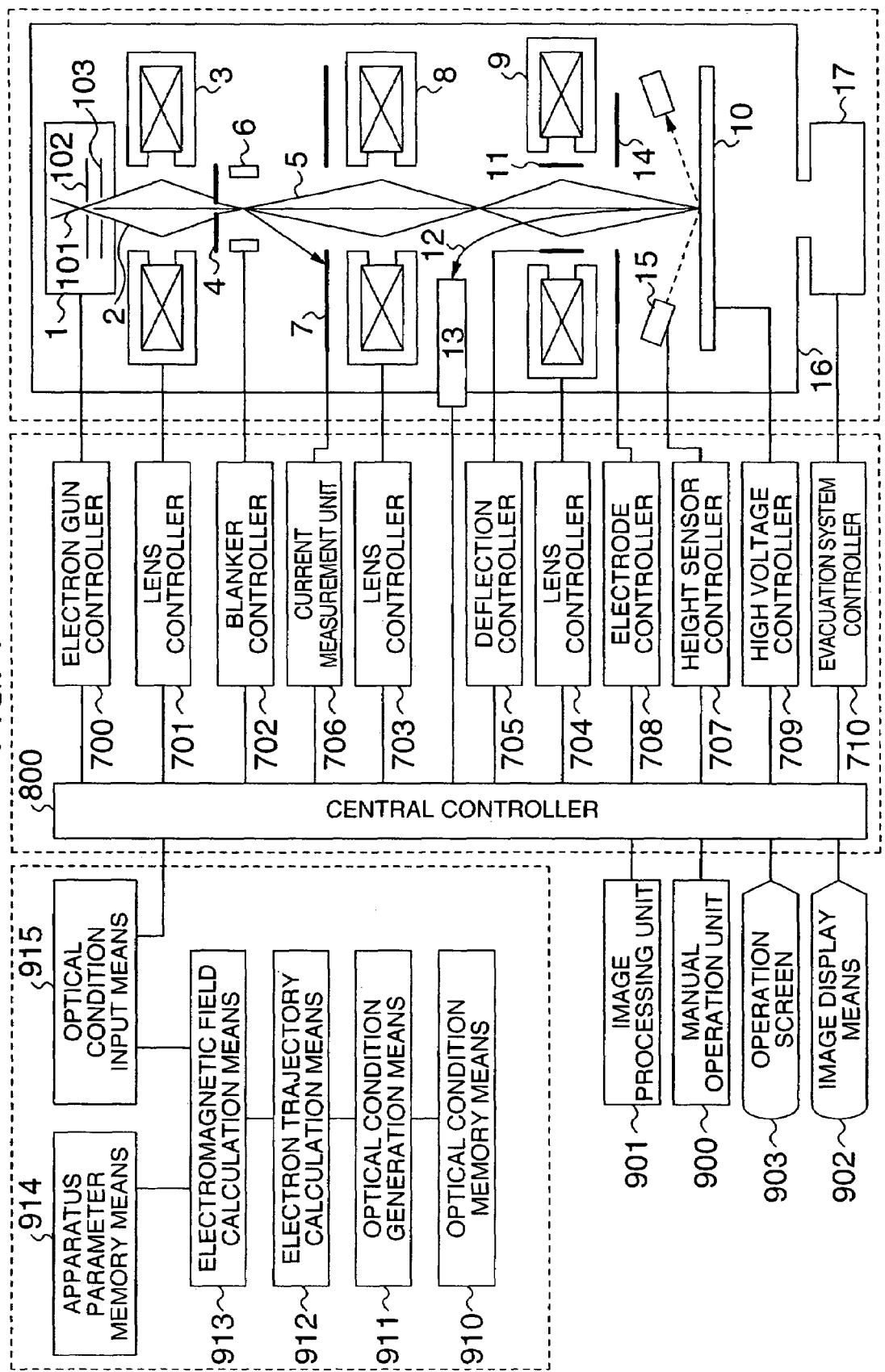

FIG. 2

| OPTICAL CONDITION α | OPTICAL CONDITION β | OPTICAL CONDITION γ |
|---|---|---|
| 1. ACCELERATING VOLTAGE α1[V]<br>2. DECELERATING VOLTAGE α2[V]<br>3. PROBE CURRENT α3[A]<br>4. CONTROL VOLTAGE α4[V]<br><br>ADJUSTMENT ITEMS<br>(A) FOCUS αA[A]<br>(B) IMAGE MAGNIFICATION αB<br>(C) IMAGE ROTATION ANGLE αC[rad]<br>(D) HEIGHT DEPENDENCY αD<br>AND THE LIKE | 1. ACCELERATING VOLTAGE β1[V]<br>2. DECELERATING VOLTAGE β2[V]<br>3. PROBE CURRENT β3[A]<br>4. CONTROL VOLTAGE β4[V]<br><br>ADJUSTMENT ITEMS<br>(A) FOCUS βA[A]<br>(B) IMAGE MAGNIFICATION βB<br>(C) IMAGE ROTATION ANGLE βC[rad]<br>(D) HEIGHT DEPENDENCY βD<br>AND THE LIKE | 1. ACCELERATING VOLTAGE γ1[V]<br>2. DECELERATING VOLTAGE γ2[V]<br>3. PROBE CURRENT γ3[A]<br>4. CONTROL VOLTAGE γ4[V]<br><br>ADJUSTMENT ITEMS<br>(A) FOCUS γA[A]<br>(B) IMAGE MAGNIFICATION γB<br>(C) IMAGE ROTATION ANGLE γC[rad]<br>(D) HEIGHT DEPENDENCY γD<br>AND THE LIKE |

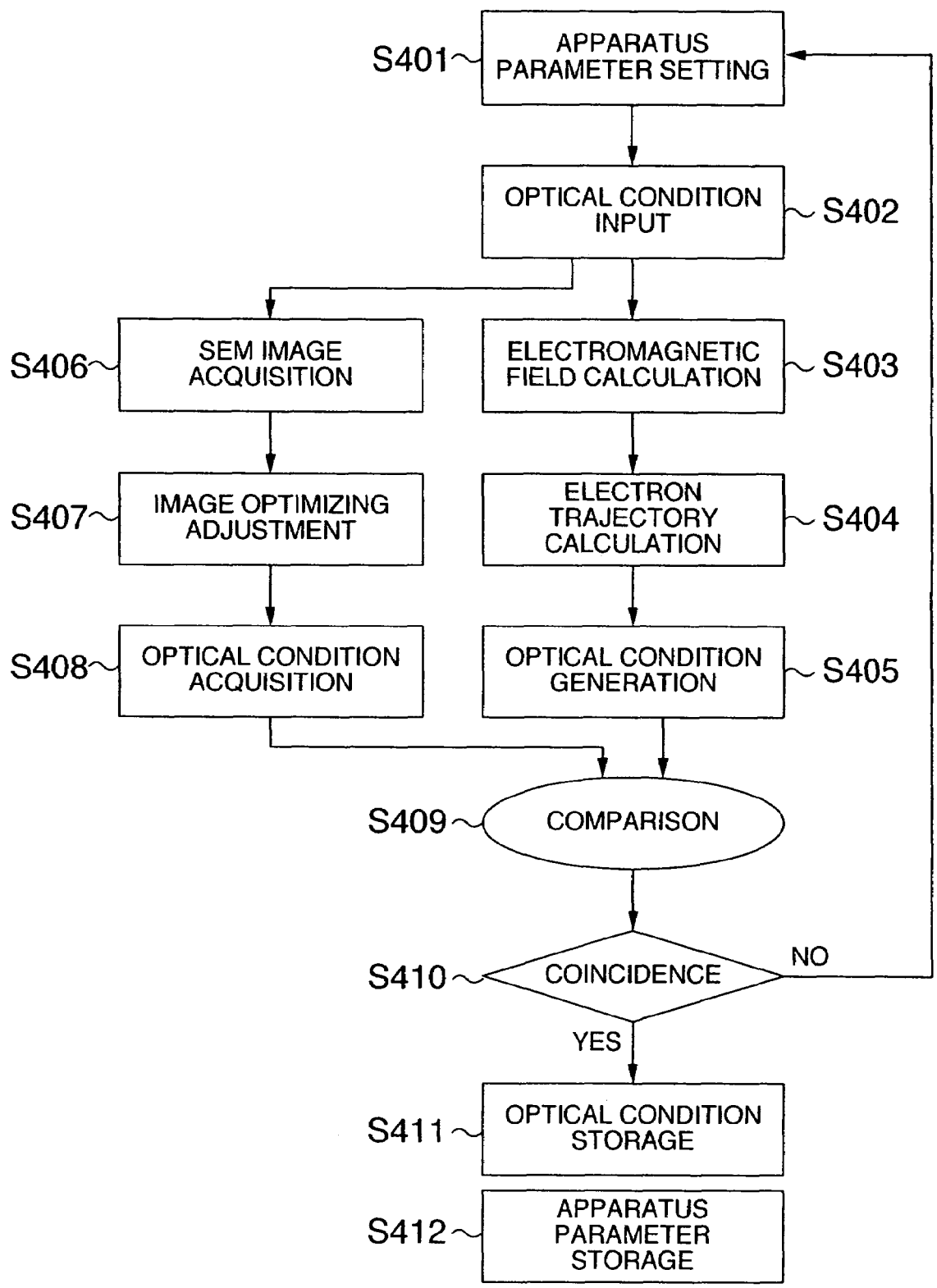

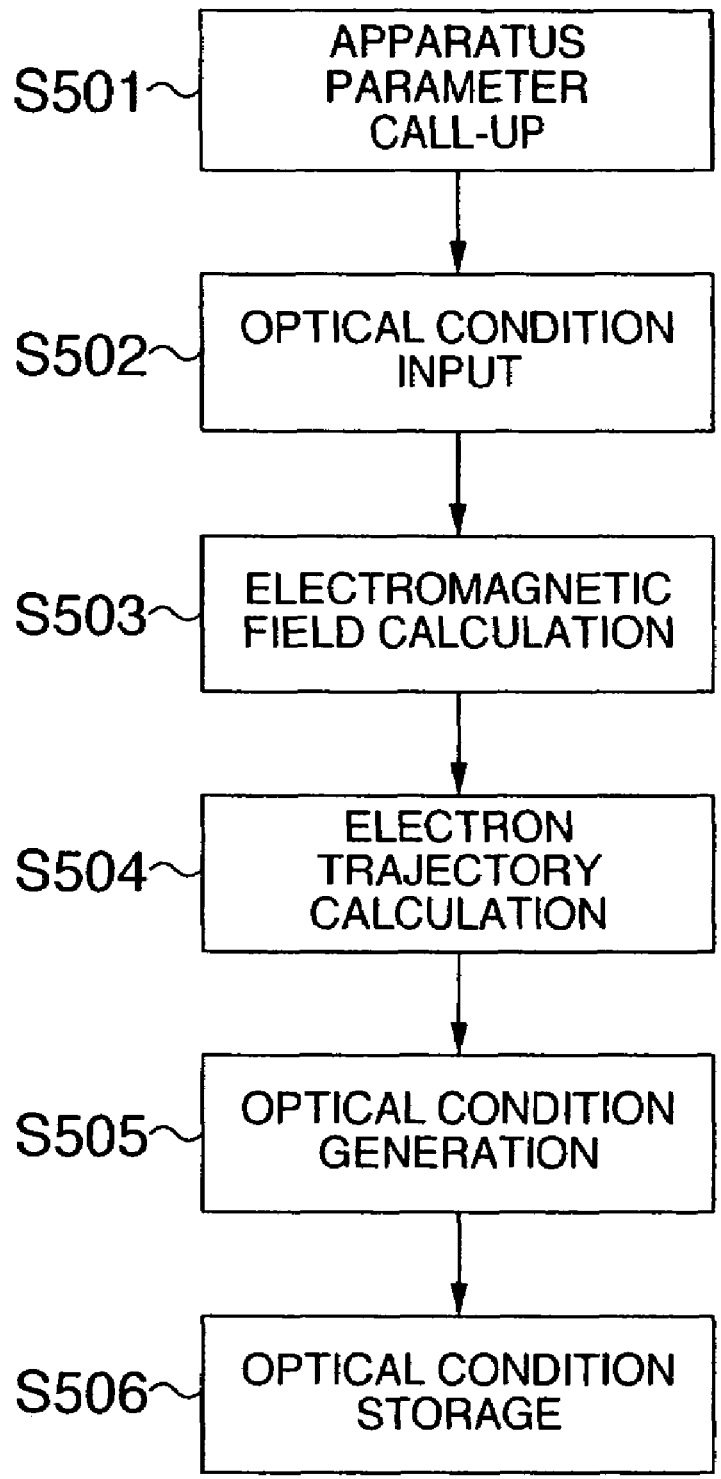

CHARGED PARTICLE BEAM APPARATUS

CROSS REFERENCE TO RELATED APPLICATIONS

This is a continuation of U.S. patent application Ser. No. 11/183,906, filed Jul. 19, 2005, claiming priority on Japanese Patent Application No. 2004-211415, filed on Jul. 20, 2004, the entirety of which are incorporated herein by reference.

BACKGROUND OF THE INVENTION

The present invention relates to a charged particle beam apparatus for obtaining an image displayed by irradiating a charged particle beam on a specimen and detecting a generation signal inclusively indicative of secondary electrons generated from the specimen.

A scanning electron microscope (hereinafter simply referred to as SEM) is available as the charged particle beam apparatus for obtaining an image by irradiating a charged particle beam on a specimen and detecting a signal secondarily generated from the specimen. Especially, in a semiconductor wafer inspection apparatus based on the SEM, a semiconductor wafer surface having a large area is observed and therefore an SEM image of high resolution needs to be acquired while maintaining a high throughput. For the sake of acquisition of a high-resolution SEM image, it is necessary that adjustment items of focus, image magnification and image rotation angle as well as dependency of these factors upon the height of a specimen be adjusted correctly. The items, however, change with an optical condition for irradiation of an electron beam on the specimen. The optical condition includes, for example, accelerating voltage of electron beam, convergence half-angle, electron beam current value and voltages applied to individual electrodes. On the other hand, with a view to maintaining a high throughput, there is no room for time to adjust the aforementioned adjustment items at each observation and it is desirable to precedently adjust and set an optical condition to be used, that is, to complete condition setting in advance. Two methods to this end have hitherto been known as will be described below.

In an image acquisition method according to prior art JP-A-2001-6588 (Patent Document 1), an SEM image is actually acquired under an optical condition desired to be set and adjustment items of focus, image magnification, image rotation angle and dependency of these factors upon specimen height are acquired and memorized when the sharpest image can be obtained. This prior art method introduced in the Patent Document 1 is obvious in setting an optical condition in the SEM.

In a function method according to prior art JP-A-2001-93831 (Patent Document 2) or U.S. Pat. No. 6,630,681, images are obtained to set several standard optical conditions. A function (in the form of either a simplified expression or a series expansion expression together with expansion coefficient table) is determined through which adjustment values under another optical condition can be calculated by interpolating adjustment values under a standard optical condition. When an optical condition desired to be set takes place, this condition is set by using the function.

In the image acquisition method as above, condition setting can be accomplished with high accuracy because setting is done while watching an actual SEM image. In the function method, on the other hand, any actual image need not be acquired under each condition setting and therefore the condition setting can be done easily within a short period of time.

But, in the image acquisition method, there needs acquisition of actual images corresponding in number to adjustment items each time that an optical condition is set and the more the adjustment items including preparation of specimens for adjustment and focus adjustment, the more the time is consumed. Further, since the user engaged in a charged particle beam apparatus employed frequently in recent years for observation, inspection and metrology of semiconductor wafer and the like is highly specialized in its operation, a worker specialized in condition setting is specially required.

On the other hand, in the function method, determination of a function must be done by trial and error in many cases each time an apparatus is designed and for example, in the case of new design of apparatus, much time is required for introducing a function. Further, even in an apparatus of the same type, adjustment values are uneven or dispersive among a plurality of products of the apparatus and the function needs to be added with parameters for adjusting itself in compliance with individual products of the apparatus. Furthermore, the parameters are empirical which fail to directly reflect causes of actual unevenness (unevenness in working, assembling and adjustment of parts of the apparatus) and hence, there is a possibility that a difference will occur between a setting value based on the function method and a true setting value. This limits accuracies of interpolation through the function. Accordingly, for ultimate settlement of adjustment values, comparison/confirmation/adjustment is sometimes needed in relation to an actual image and operation becomes complicated and time-consuming.

As an example of correcting an optical condition without resort to the two prior art methods, there is available a method according to which a means for calculating a trajectory of a charged particle beam is carried in a charged particle beam apparatus. Specifically, according to a charged particle beam exposure apparatus disclosed in Patent Document 2, an optical condition affected by space charge effect can be corrected by the charged particle beam trajectory calculation means mounted to the exposure apparatus but when setting of optical conditions in the wide range is required, a method is desired which can obtain highly accurately not only correction terms attributable to the space charge effect but also all of the aforementioned adjustment items through the use of the trajectory calculation without resort to acquisition of actual images.

SUMMARY OF THE INVENTION

An object of the present invention is to provide a charged particle beam apparatus capable of dealing with the above problems and performing highly accurate condition setting easily within a short period of time.

More specifically, this invention intends to provide a charged particle beam apparatus incorporating a setting method which can perform highly accurate setting while eliminating temporal/technical restrictions imposed on optical condition setting and dispensing from comparison with actual images and which can be immune to the influence of apparatus change and new apparatus development.

According to the present invention, a charged particle beam apparatus for obtaining an image by irradiating a charged particle beam on a specimen and detecting a generation signal inclusively indicative of secondary electrons generated from the specimen, comprises input means for inputting current and voltage values to be applied to a charged particle optical system through which the charged particle beam travels, memory means for storing shape, position and physical properties of the charged particle optical system as well as accuracy of applied current or voltage, electromagnetic field calculation means for calculating an electromagnetic field near a charged particle beam path, charged particle trajectory calculation means for calculating a trajectory of the charged particle beam in a calculated electromagnetic field, memory means for storing a result of the trajectory calculation and a controller for controlling the charged particle optical system on the basis of the calculation result.

Advantageously, this invention can provide a charged particle beam apparatus capable of performing highly accurate condition setting easily within a short period of time.

Prior to describing embodiments of the present invention in greater detail with reference to the accompanying drawings, features of the invention are given as below.

An apparatus relating to the present invention comprises input means for inputting current and voltage values to be applied to a charged particle optical system through which a charged particle beam travels, memory means for storing shape, position and physical properties of the charged particle optical system as well as accuracy of the applied current or voltage, electromagnetic field calculation means for calculating an electromagnetic field near a charged particle beam path, charged particle trajectory calculation means for calculating a trajectory of the charged particle beam in a calculated electromagnetic field, memory means for storing a result of the trajectory calculation and a controller for controlling the charged particle optical system on the basis of the calculation result.

In the present invention, the electromagnetic field calculation and charged particle trajectory calculation are carried out by means of a simulator capable of implementing iterative calculation.

The present invention further comprises display means capable of displaying the shape, position and physical properties of the charged particle optical system, the accuracy of the applied current or voltage and the result of trajectory calculation.

Further, in the present invention, an optical condition is acquired by making a proper image adjustment to an acquired SEM image, the optical condition is compared with a calculative optical condition acquired by going through the trajectory calculation and when coincidence stands in the comparison, the optical condition is stored in the optical condition memory means.

With this construction, if the shape and position of the charged particle optical system the charged particle beam apparatus has and the applied current and voltage can be known sufficiently accurately, adjustment items of a desired optical condition can be calculated accurately by means of the electromagnetic field calculation means and charged particle trajectory calculation means.

Especially, by using such a calculation means as simulator, temporal/technical restrictions imposed on operation per se can be eliminated. By sufficiently introducing differences in products of the charged particle beam apparatus into the memory means for storing the shape and position of the charged particle optical system, acquisition of an actual image for the sake of confirmation after condition setting can be dispensed with. Further, when making a new design of apparatus, it suffices that only an apparatus structure to be memorized is exchanged, so that the algorithm of condition setting can remain unchanged and time consumed to find out a function during new design of apparatus can be decreased.

Other objects, features and advantages of the invention will become apparent from the following description of the embodiments of the invention taken in conjunction with the accompanying drawings.

BRIEF DESCRIPTION OF THE DRAWINGS

FIG. 1 is a block diagram showing schematic construction of an SEM type wafer inspection apparatus according to an embodiment of the invention.

FIG. 2 is a diagram for explaining optical conditions in the embodiment of the invention.

FIG. 4 is a flowchart of initial setting in the embodiment of the invention.

FIG. 5 is a flowchart of normal condition setting in the embodiment of the invention.

DESCRIPTION OF THE INVENTION

Figure 3:
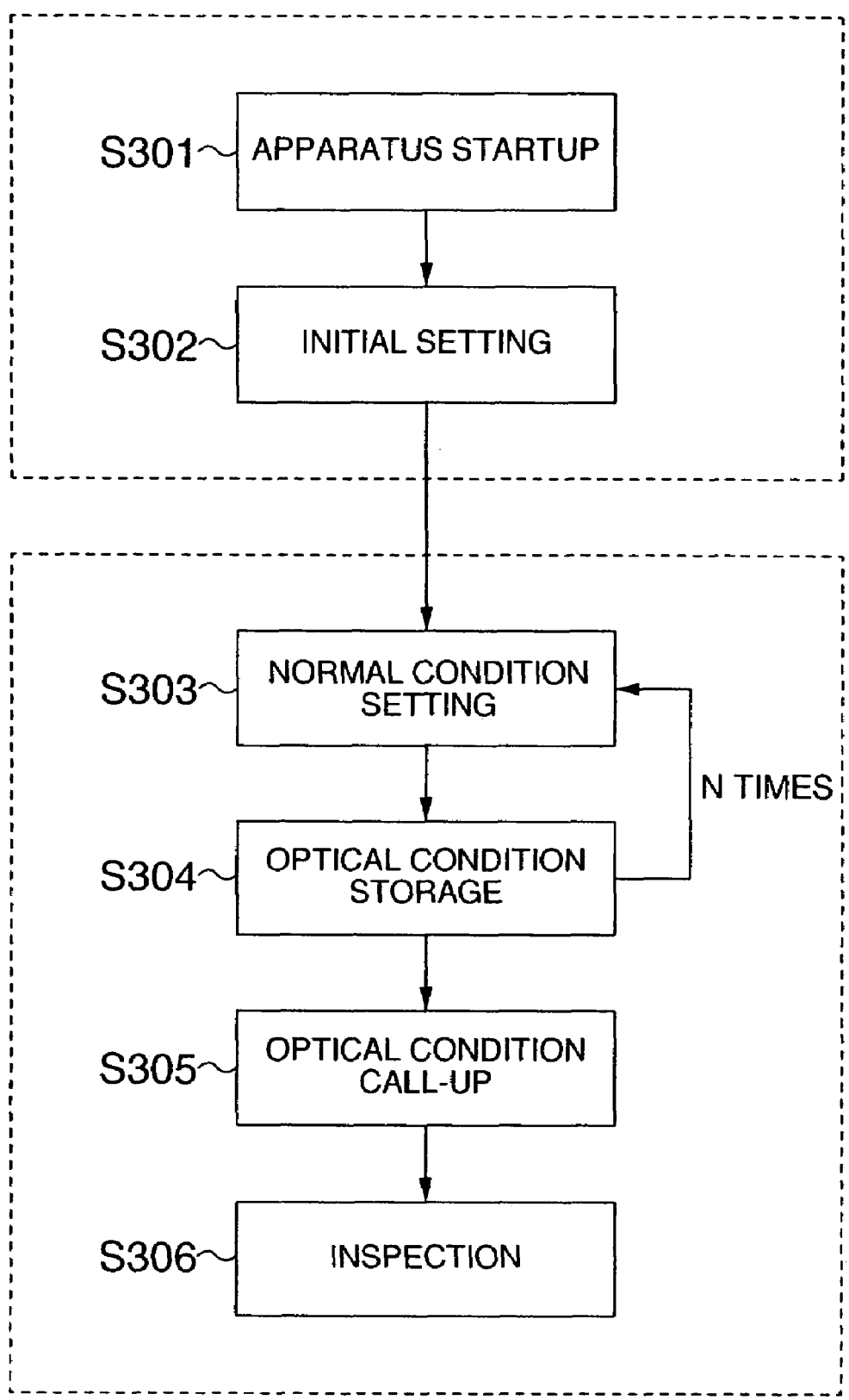
FIG. 3 is a flowchart of an inspection by the inspection apparatus in the embodiment of the invention.

An embodiment of the present invention will now be described specifically by way of example of a semiconductor circuit pattern defect inspection apparatus based on a scanning electron microscope (hereinafter referred to as SEM type wafer inspection apparatus).

Referring to FIG. 1, construction of the SEM type wafer inspection apparatus will be described.

In an electron gun 1 controlled by an electron gun controller 700, an extracting voltage V1 applied across electron source 101 and extracting electrode 102 and thermal energy applied to the electron source 101 cooperate to emit an electron beam 2 representing a charged particle beam.

The electron beam 2 is accelerated to an outgoing energy level $E0=e|Vo|$ by an accelerating voltage Vo applied to an accelerating electrode 103 so as to be emitted from the electron gun 1. The emitted electron beam 2 is condensed by a first condenser lens 3 controlled by a lens controller 701 and is then admitted through a beam limiting aperture 4 to take the form of an electron beam probe 5. The beam is deflected by a blanker 6 as necessary, with the result that a probe current Ip to be irradiated on a specimen 10 is received by a Faraday cup 7 and measured by a current measurement unit 706. The blanker 6 is controlled by a blanker controller 702.

The electron beam probe 5 is further condensed by a second condenser lens 8 controlled by a lens controller 703 and is then focused on the specimen 10 by an objective lens 9 controlled by an objective lens controller 704. At that time, the electron beam probe 5 is affected by a decelerating voltage Vr applied to the specimen 10 so as to be decelerated to an on-specimen irradiation energy level $Es=|eVo-Vr|$. The electron beam probe 5 is scanned on the specimen 10 by means of a deflector 11. A deflection width at that time is proportional to deflection sensitivity K. As a result, a generation signal represented by a secondary electron signal 12 is generated from the specimen 10 and detected by a secondary electron detector 13. The generation signal also includes reflected electrons. The deflector 11 is controlled by means of a deflection controller 705. The decelerating voltage Vr is controlled with a high-voltage controller 709.

A control electrode 14 disposed near the objective lens 9 is applied with a control voltage Vc to control the trajectory of secondary electrons. As necessary, the control electrode 14 is applied with either a voltage higher than that applied to the specimen to increase the amount of secondary electrons detected by the secondary electron detector or a voltage lower than that applied to the specimen to return secondary electrons to the specimen, thereby controlling the amount of electrification of the specimen. The height of a portion to be observed on the specimen 10 is measured with a height sensor 15 controlled by a height sensor controller 707. The control electrode 14 is controlled with an electrode controller 708.

A region through which the electron beam passes is sealed off by a vacuum vessel 16 and is maintained at high vacuum by means of an evacuation unit 17 controlled by an evacuation system controller 710. The respective controllers described as above are concentrated to a central controller 800. A user selects an optical condition used for inspection from a list of optical conditions displayed on an operation screen 903 and inputs the selected optical condition to the central controller 800 by operating a manual operation unit 900 so that individual control values (VO, Ip, Vr and Vc) may be settled.

The detected secondary electron signal is imaged at an image processing unit 901. Since image magnification M is in inverse proportion to deflection sensitivity K and an image is rotated through an image rotation angle θ, adjustments are made as necessary. In the image processing unit 901, the image is compared with a reference image to detect defects. The image is displayed on an image display means 902 as necessary.

In the inspection apparatus based on SEM constructed as above, an optical condition is selected which is optimized for the kind of wafer and the processor and therefore a large number of optical conditions need to be stored precedently in an optical condition memory means 910.

In addition to the optical condition memory means 910, the inspection apparatus based on SEM has an optical condition generation means 911, an electron trajectory calculation means 912, an electromagnetic field calculation means 913, an apparatus parameter memory means 914 and an optical condition input means 915. The electron trajectory calculation means 912 and electromagnetic field calculation means 913 are implemented with the same CPU but they are under the direction of different programs.

A combination of optical conditions will now be described.

One optical condition is determined by a combination of the following factors.

(1) Accelerating voltage : V0
(2) Decelerating voltage : Vr
(3) Probe current : Ip
(4) Control voltage : Vc When an optical condition is settled by designating a combination of these factors, in order to obtain an SEM image, (A) focus (objective lens control value) I must be adjusted in relation to the specimen 10 mounted at a predetermined height Zo.

Further, the deflection sensitivity K and image rotation angle θ of electron beam 2 change with the optical condition and hence, (B) the image magnification (deflector control value) M and (C) the image rotation angle (deflector control value) θ must be adjusted correctly.

Supposedly, the specimen is a semiconductor wafer having different heights at different points on the wafer surface and therefore the aforementioned (A), (B) and (C) must be changed in accordance with a specimen height read by the height sensor. For this end, setting of (D) specimen height dependency (height sensor control value) of (A), (B) and (C) as represented by dI/dZ, dM/dZ and dθ/dz must be effected. With these items (A) to (D) set, setting of the optical condition is completed.

This situation is diagrammatically shown in FIG. 2.

In the figure, different optical conditions α, β and γ are indicated. As described previously, since the optical condition is determined by a combination of factors of accelerating voltage V0, decelerating voltage Vr, probe current Ip and control voltage Vc, each of the actual optical conditions α, β and γ can be a range of numerical values of the above factors.

For one optical condition thus designated, adjustment values of items (A) to (D) are adjusted and stored in the optical condition memory means 910, completing condition setting for this optical condition.

In other words, current and voltage applied to the charged particle optical system such as accelerating voltage V0, decelerating voltage Vr, probe current Ip and control voltage Vc are inputted by means of the optical condition input means 915 and adjustment values of the (A) to (D) are properly adjusted and then stored in the optical condition memory means 910.

Next, how to use the SEM type wafer inspection apparatus will be described with reference to a flowchart shown in FIG. 3.

Firstly, the apparatus is started up (step S301) and apparatus parameters are acquired in initial setting (step S302) to set a standard optical condition. The above two steps are worked out on the apparatus maker side.

The following steps are to be carried out by a user.

Optical conditions necessary for inspection are set in normal condition setting (step S303) and the optical conditions are stored (step S304). The steps S303 and 304 repeat themselves by the number of necessary optical conditions (N times). Accordingly, it is important that this working can be completed easily within a short period of time. Next, in optical condition call-up (step S305), an optical condition used for inspection is called up and an inspection is conducted (step S306).

Next, the initial setting and normal condition setting will be described in greater detail.

The initial setting will first be explained with reference to a flowchart shown in FIG. 4.

Firstly, apparatus parameters are set to suitable ones (step S401). In the apparatus parameter setting, parameters such as design values of shape and position of electron source 101, electrodes, lenses, specimen and others, and current and voltage applied to the lenses and slight differences from the design values (hereinafter called product differences) are set in the apparatus parameter memory means 914, these parameters being used for electromagnetic field calculation by means of the electromagnetic field calculation means 913 and electron trajectory calculation by means of the electron trajectory calculation means 912.

These product differences are attributable to mechanical working, assembling and adjustment errors of the apparatus and they are fetched into the apparatus parameter memory means 914. Thereafter, a standard optical condition is inputted (step S402). For inputting, the operation screen 903 and manual operation unit 900 are used. Subsequently, an electromagnetic field calculation is made by means of the electromagnetic field calculation means 913 (step S403).

The calculation of an electromagnetic field can be accomplished by solving an electromagnetic field equation when the position and shape of electrodes constituting lenses and those of the lenses are determined in accordance with the settled apparatus parameters and lens current and voltage given by the optical condition are applied. The probe current value represents the amount of current of the electron beam 2 passing through the beam limiting aperture 4 and is determined by a current value of condenser lens 3 and an electron gun control value. Accordingly, with the probe current Ip given to the optical condition, the condenser lens value and electron gun control value can be given.

An electric field $E(x, y, z)$ can be determined directly from a Maxwell's equation or may be determined by spatially differentiating electrostatic potential $\Phi(x, y, z)$. In the latter case, the calculation of $\Phi D(x, y, z)$ can be done by solving a Laplace equation under boundary conditions of voltages applied to the respective electrodes.

A magnetic field B(x, y, z) can also be determined directly from the Maxwell's equation but in the absence of any space current, scalar potential Ψ (x, y, z) (magnetic scalar potential) can be defined as in the case of electric field and therefore, a Laplase equation may be solved under boundary conditions of magnetic scalar potential of respective magnetic poles.

The electromagnetic field can be calculated in the manner as above but since the focus is determined subsequently in condition setting, the objective lens value is still unknown in this phase. Generally, a magnetic lens is used as the objective lens in the SEM and therefore, the value of a current to be passed through the magnetic lens is still unknown. As a result, the aforementioned magnetic field cannot be determined. But because of linearity of the electromagnetic field, it suffices that a magnetic field is calculated by substituting a representative current value. When determining the focus after an electron trajectory is calculated as will be described later, the objective lens current value may be changed to obtain a correct current value. Even when the objective lens is of the electrostatic type, lens potential similarly set to a representative value can be used. Even a magnetic and electrostatic lens can be handled similarly. In the following, the objective lens is supposed to be a magnetic lens.

In the above method, the calculation of an electromagnetic field needs to be done each time that the optical condition to be set changes. But, as far as the apparatus construction is rendered unchanged, by taking advantage of the linearity of electromagnetic field, the space potential Φ can also be determined from a linear combination equation $$\Phi = \sum_i Vi\phi i$$

in accordance with a combination {$V_i$} of electrode voltages corresponding to an actual optical condition by calculating a space potential $\phi_i$ formed when unit potential is applied in advance to a certain electrode i and the remaining electrodes are grounded.

In this case, the computational quantity can be decreased to a great extent.

Next, an electron trajectory in the electromagnetic field is calculated by means of the electron trajectory calculation means 912 (step S404).

Available as a method for electron trajectory calculation is either a direct trajectory tracing method of directly solving an equation of motion for an electron in the electromagnetic field or a method of solving a paraxial ray equation (H. C. Zhu and E. Munro, Optik 61 (1982), pp. 121-145) in the case of the electron beam trajectory being sufficiently close to the optical axis.

The optical condition generation means 911 is used to determine optical condition item (A) from an objective lens current value when the electron beam 2 is focused on the specimen 10, optical condition items (B) and (C) from the electron trajectory and a position on specimen where the electron beam 2 reaches and optical condition item (D) from the (A), (B) and (C) when the specimen position is changed (step S405).

The electron trajectory calculation is conducted while changing the objective lens current value and an objective lens current value at the time that the electron beam is focused on the specimen is determined as a focus. The space magnetic field changes each time that the objective lens current value is changed but the magnetic field due to the objective lens is proportional to the current and hence when taking advantage of the linearity of magnetic field as described previously, there is no need of totally resolve the magnetic field calculation.

Further, with the objective lens current fixed to the focus, an electron trajectory is calculated when a deflection voltage is applied to the deflector. From a position at which the electron trajectory comes in the specimen 10, a deflection width on the specimen 10 and a rotation angle of electron beam 2 about the optical axis can be calculated. From these quantities, an image magnification and an image rotation angle can be obtained.

To determine the dependency of focus, image magnification and image rotation angle upon the specimen height, calculations similar to the above are conducted while changing the specimen position, so that differential coefficients of focus, image magnification and image rotation angle by the specimen height can be obtained.

On the other hand, for the same optical condition, optical condition factors (1) to (4) are inputted to the central controller 800 and an SEM image is acquired by means of the image display means 902 (step S406). In connection with this image, image optimizing adjustment for changing the objective lens current value, deflection amount and specimen height is carried out by means of the manual operation unit 900 to obtain the sharpest image (step S407). From the objective current value and the like corresponding to the optimized image, the optical condition generation means 911 settles optical condition items (A) to (D) (step S408). The aforementioned adjustment may otherwise be made automatically by using the automatic focus function which has hitherto been proposed widely.

The thus obtained optical condition items are compared with those obtained in the step S405 by means of the optical condition generation means 911 (step S409) and if coincidence stands, the optical condition is stored in the optical condition memory means (steps S410 and S411) and besides, the initially set apparatus parameters are stored in the apparatus parameter memory means 914 (step S412).

If non-coincidence stands, apparatus parameters are set again, the electromagnetic field calculation, electron trajectory calculation and optical condition generation are carried out iteratively until coincidence of the optical condition generated by the optical condition generation means 911 is settled. Iterative operation is applied to the electromagnetic field calculation, electron trajectory calculation and optical condition generation but it suffices that the SEM image acquisition, image optimizing adjustment and optical condition acquisition are carried out once (setting of apparatus parameters has no influence upon an actual SEM image).

Similar generation and comparison are iterated by the number of reference optical conditions and then the initial setting ends. If the accuracy of coincidence at that time is sufficiently high, condition setting can be done without comparing calculation values with an actual SEM image in the succeeding normal condition setting.

In the initial setting as above, according to the method of fetching the construction of the apparatus and working/assembling/adjustment error as the apparatus parameters, only sufficient enumeration of the shape of apparatus and portions where errors take place suffices, so that determination of function and development coefficients by trial and error as in the function method is unneeded and time to deal with the apparatus change can be shortened.

Next, normal condition setting shown in FIG. 5 will be described. In the normal condition setting, when the aforementioned (1) to (4) are given, the optical condition setting for the aforementioned (A) to (D) to solve the problems the present invention faces is determined.

Reference is made to a flowchart of FIG. 5.

Firstly, the apparatus parameters stored through the initial setting are called up (step S501). Call-up is carried out through the operation screen 903 by means of the manual operation unit 900. Next, an optical condition desired to be set is inputted (step S502) and an electromagnetic field calculation is conducted (step S503). The calculation method is the same as that described in connection with the initial setting. Subsequently, an electron trajectory calculation is done by means of the electron trajectory calculation means 912 (step S504). The electron trajectory calculation method also follows that in the initial setting. Thereafter, an optical condition is generated using the optical condition generation means 911 (step S505) and stored in the optical condition memory means 910 (step S506).

In the initial setting and normal condition setting, the electromagnetic field calculation and electron trajectory calculation are conducted iteratively but by using an automatic calculation means such as simulator as the calculation means, work time and setting time by the user can both be shortened, thus permitting the user to conduct operation per se with ease.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A charged particle beam apparatus for
obtaining an image by irradiating a charged particle beam on a specimen and detecting a generation signal inclusively indicative of secondary electrons generated from the specimen, comprising:
input means for inputting current and voltage values to be applied to a charged particle optical system through which said charged particle beam travels;
memory means for storing shape, position and physical properties of said charged particle optical system and accuracy of the applied current or voltage;
charged particle trajectory calculation means for calculating an electromagnetic field near a charged particle beam path on the basis of contents read out from said memory means and a trajectory of said charged particle beam in the calculated electromagnetic field.

2. A charged particle beam apparatus according to claim 1 wherein the shape, position and physical properties of said charged particle optical system includes material processing and part assembly of said charged particle optical system and variation of adjustment error of said apparatus.

3. A charged particle beam apparatus according to claim 1, wherein
a condition setting is acquired by making a proper image adjustment to an image obtained under a predetermined optical condition; and
said predetermined optical Condition is compared with a calculative optical condition acquired by going through said trajectory calculation under said predetermined optical condition;
the shape, position and physical properties of said charged particle optical system and the accuracy of the applied current or voltage are calculated so that said calculative optical condition corresponds with said optical condition as a result of the comparison of them, and a result of said calculation at the correspondence is stored in said memory means; and
further comprising, in an optical condition different from said predetermined optical condition, calculation means for calculating a trajectory of said charged particle beam on the basis of the contents read our form said memory means, and setting means for performing condition setting on the basis of a result of the trajectory calculation at the different optical condition.

* * * * *